US010256772B2

(12) United States Patent
Ueno

(10) Patent No.: US 10,256,772 B2
(45) Date of Patent: *Apr. 9, 2019

(54) SHIFT CONTROL CIRCUIT AND WIRELESS DEVICE

(71) Applicant: ICOM INCORPORATED, Osaka (JP)

(72) Inventor: Yasuo Ueno, Osaka (JP)

(73) Assignee: ICOM INCORPORATED, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/692,673

(22) Filed: Aug. 31, 2017

(65) Prior Publication Data

US 2018/0091097 A1 Mar. 29, 2018

(30) Foreign Application Priority Data

Sep. 27, 2016 (JP) .................. 2016-188512

(51) Int. Cl.
*H03D 3/18* (2006.01)
*H03C 3/09* (2006.01)
(Continued)

(52) U.S. Cl.
CPC .................. *H03C 3/09* (2013.01); *H02J 3/24* (2013.01); *H03C 3/06* (2013.01); *H03D 3/18* (2013.01);
(Continued)

(58) Field of Classification Search
CPC .... H03C 3/09; H03C 3/06; H02J 3/24; H03D 3/18; H03G 3/3063; H03G 7/002;
(Continued)

(56) References Cited

U.S. PATENT DOCUMENTS 6,137,353 A * 10/2000 Stroet ................ H03D 3/02
329/336
9,917,565 B2 * 3/2018 Song ................ H03G 5/165
(Continued)

FOREIGN PATENT DOCUMENTS

JP 61-265930 A 11/1986

*Primary Examiner* — Janice N Tieu
(74) *Attorney, Agent, or Firm* — Ohlandt, Greeley, Ruggiero & Perle, L.L.P.

(57) ABSTRACT

A signal input from a microphone is A-D converted by an A-D converter, is frequency differentiated by a pre-emphasis circuit, and is input to a shift control circuit. The shift control circuit includes a limiter circuit, a phase shifter, and a harmonic suppressor. The limiter circuit performs amplitude limitation so as to limit the amplitude of the input control target signal to be equal to or less than a first threshold. The phase shifter shifts, for the control target signal having the amplitude limited, a phase of a frequency component within the predetermined frequency range. The harmonic suppressor suppresses, for the control target signal phase-shifted by the phase shifter, a frequency component equal to or greater than a second threshold, and outputs an information signal that is the control target signal having the frequency component of equal to or greater than the second threshold suppressed. The modulator performs frequency modulation on a carrier wave in accordance with the information signal. The transmitter produces a transmission signal from the frequency-modulated carrier wave, and transmits the transmission signal via an antenna.

9 Claims, 7 Drawing Sheets

(51) Int. Cl.
*H02J 3/24* (2006.01)
*H03C 3/06* (2006.01)
*H03G 3/30* (2006.01)
*H03J 7/02* (2006.01)
*H04B 1/16* (2006.01)
*H04N 9/66* (2006.01)
*H03G 7/00* (2006.01)
*H04B 1/04* (2006.01)

(52) U.S. Cl.
CPC ........... *H03G 3/3063* (2013.01); *H03G 7/002* (2013.01); *H03J 7/02* (2013.01); *H04B 1/0475* (2013.01); *H04B 1/1661* (2013.01); *H04N 9/66* (2013.01); *H04B 2001/0425* (2013.01)

(58) Field of Classification Search
CPC ........... H03J 7/02; H04B 1/1661; H04N 9/66; H05K 999/99
See application file for complete search history.

(56) References Cited

U.S. PATENT DOCUMENTS

| | | | |
|---|---|---|---|
| 9,933,467 B1* | 4/2018 | Stein | G01R 23/175 |
| 2006/0099918 A1* | 5/2006 | Yamaguchi | H03C 3/06 455/126 |

* cited by examiner

SHIFT CONTROL CIRCUIT AND WIRELESS DEVICE

CROSS-REFERENCE TO RELATED APPLICATION

This application claims the benefit of Japanese Patent Application No. 2016-188512, filed on Sep. 27, 2016, the entire disclosure of which is incorporated by reference herein.

FIELD

This application relates generally to a shift control circuit and a wireless device including the same.

BACKGROUND

In frequency modulation (FM) wireless devices, in order to set the maximum modulation degree (maximum frequency shift) in frequency modulation to be equal to or less than a prescribed value, an instantaneous deviation control (IDC) circuit is provided. A carrier wave is frequency-modulated in accordance with an output of the IDC circuit. This IDC circuit includes a limiter circuit and a splatter filter. In the limiter circuit, the amplitude of the input signal to the IDC circuit is restricted, and harmonic components produced at the limiter circuit are suppressed by the splatter filter.

In the wireless transceiver device disclosed in Unexamined Japanese Patent Application Kokai Publication No. S61-265930, sound signals from a microphone are frequency differentiated by a pre-amplifier and a pre-emphasis circuit, and a high-level signal is clipped by a limiter amplifier. In addition, the splatter filter suppresses harmonic components produced by clipping. The limiter amplifier and the splatter filter constitute the IDC circuit.

SUMMARY

A shift control circuit according to a first aspect of the present disclosure is provided in a wireless device that performs frequency modulation, and outputs an information signal to be applied to the frequency modulation. The shift control circuit includes:

a limiter circuit that limits an amplitude of an input control target signal to be equal to or less than a first threshold;

a phase shifter that shifts, for the control target signal having the amplitude limited by the limiter circuit, a phase of a frequency component within a predetermined frequency range by a predetermined amount; and a harmonic suppressor that suppresses, for the control target signal phase-shifted by the phase shifter, a frequency component equal to or greater than a second threshold, and outputs the information signal that is the suppressed control target signal.

Preferably, the phase shifter is an all-pass filter including an infinite impulse response filter, and the harmonic suppressor is a splatter filter including a finite impulse response filter.

Preferably, the phase shifter and the harmonic suppressor are formed by a single splatter filter including an infinite impulse response filter.

A wireless device according to a second aspect of the present disclosure includes:

a shift control circuit that includes a limiter circuit that limits an amplitude of an input control target signal to be equal to or less than a first threshold, a phase shifter that shifts, for the control target signal having the amplitude limited by the limiter circuit, a phase of a frequency component within a predetermined frequency range by a predetermined amount, and a harmonic suppressor that suppresses, for the control target signal phase-shifted by the phase shifter, a frequency component equal to or greater than a second threshold, and outputs the information signal that is the suppressed control target signal;

a modulator that performs frequency modulation so as to change a frequency of a carrier wave in accordance with a signal level of the information signal; and a transmitter that produces a transmission signal from the carrier wave frequency-modulated by the modulator, and transmits the produced signal via an antenna.

Preferably, the wireless device further includes an adjuster that adjusts, in accordance with an occupied bandwidth of the transmission signal, at least one of followings: the frequency range that is a target for the phase shift by the phase shifter and the predetermined amount of the phase shift; and the second threshold of the harmonic suppressor.

According to the present disclosure, by shifting, for the control target signal having the amplitude limited by the limiter circuit, a phase of a frequency component within the predetermined frequency range, the variability in the maximum frequency shift in frequency modulation per frequency can be suppressed.

BRIEF DESCRIPTION OF THE DRAWINGS

A more complete understanding of this application can be obtained when the following detailed description is considered in conjunction with the following drawings, in which.

DETAILED DESCRIPTION

Figure 1:
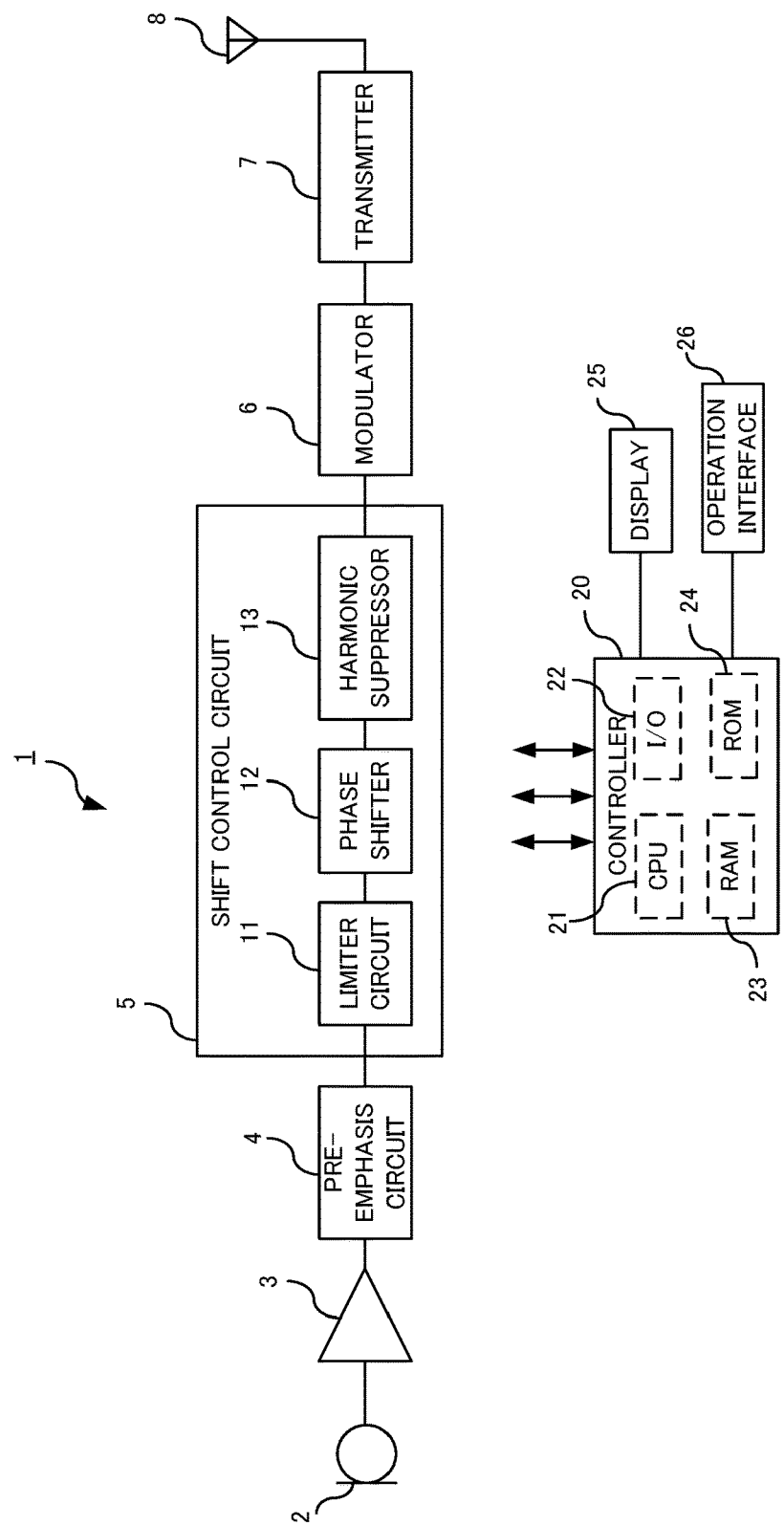
FIG. 1 is a block diagram illustrating an example configuration of a wireless device according to an embodiment of the present disclosure.

When an instantaneous deviation control (IDC) circuit is accomplished by digital circuits, since the attenuation characteristics of a splatter filter are sharp in comparison with those of analog circuits, harmonic components are severely suppressed in comparison with a case of analog circuits. When the harmonic components are severely suppressed, the wave height value of a signal to be applied to frequency modulation varies per frequency. Hence, the maximum frequency shift varies depending on the frequency. When, for example, the filter in the IDC circuit is adjusted in such a way that the maximum value of the maximum frequency shift becomes equal to or less than a prescribed value, the modulation may become difficult for a signal at the frequency corresponding to the minimum value of the maximum frequency shift.

The present disclosure has been made in view of the foregoing circumstances, and an objective is to suppress a variability of the maximum frequency shift in frequency modulation per frequency.

Embodiments of the present disclosure are described in detail with reference to the figures below. The same or equivalent component is denoted by the same reference numeral throughout the figures.

FIG. 1 is a block diagram illustrating an example configuration of a wireless device according to an embodiment of the present disclosure. A wireless device 1 includes a microphone 2, an analog-to-digital (A-D) converter 3 that performs analog-to-digital conversion on the input from the microphone 2, a pre-emphasis circuit 4 that performs frequency differentiation, and a shift control circuit 5 that adjusts a frequency shift. This wireless device 1 further includes a modulator 6 that performs frequency modulation in accordance with an information signal output by the shift control circuit 5, a transmitter 7 that produces a transmission signal in accordance with the output of the modulator 6, and transmits the produced transmission signal via an antenna 8, a controller 20, a display 25, and an operation interface 26. The shift control circuit 5 is an IDC circuit, and includes a limiter circuit 11 that performs amplitude limitation, a phase shifter 12 that performs phase shift, and a harmonic suppressor 13 that suppresses harmonic components. The controller 20 includes a central processing unit (CPU) 21, a random access memory (RAM) 23, and a read-only memory (ROM) 24. The subsequent stages to the A-D converter 3 may be accomplished by a digital signal processor (DSP).

In order to avoid the complexity of description and to facilitate understanding, in FIG. 1, signal lines from the controller 20 to each component of the wireless device 1 are omitted. The controller 20 is connected to each component of the wireless device 1 via an input/output (I/O) interface 22, and controls the start, end, and details of the process by each component. The CPU 21 executes a control program stored in the ROM 24, and controls the wireless device 1. In addition, the CPU 21 processes a command or data input from the operation interface 26 via the I/O interface 22, temporarily stores the processed command or data in the RAM 23, and the CPU 21 makes the display 25 display the stored command or data. The display 25 includes, for example, a liquid crystal display (LCD). In the example illustrated in FIG. 1, only the transmitter function of the wireless device 1 is illustrated, but the wireless device 1 may also have a receiver function.

A description is given of operation of each component in the wireless device 1. When a signal transmission is instructed from the operation interface 26, the microphone 2 outputs analog sound signals to the A-D converter 3 in accordance with input sounds. The A-D converter 3 converts the analog sound signals from the microphone 2 into digital signals, and outputs the digital signals to the pre-emphasis circuit 4. The pre-emphasis circuit 4 outputs a signal in a level proportional to the frequency of the input signal, that is, performs frequency differentiation, and pre-emphasizes the relative intensity of the harmonic components in the signal having undergone the frequency differentiation in order to improve the signal-to-noise (S/N) ratio at the receiver side.

Figure 2:
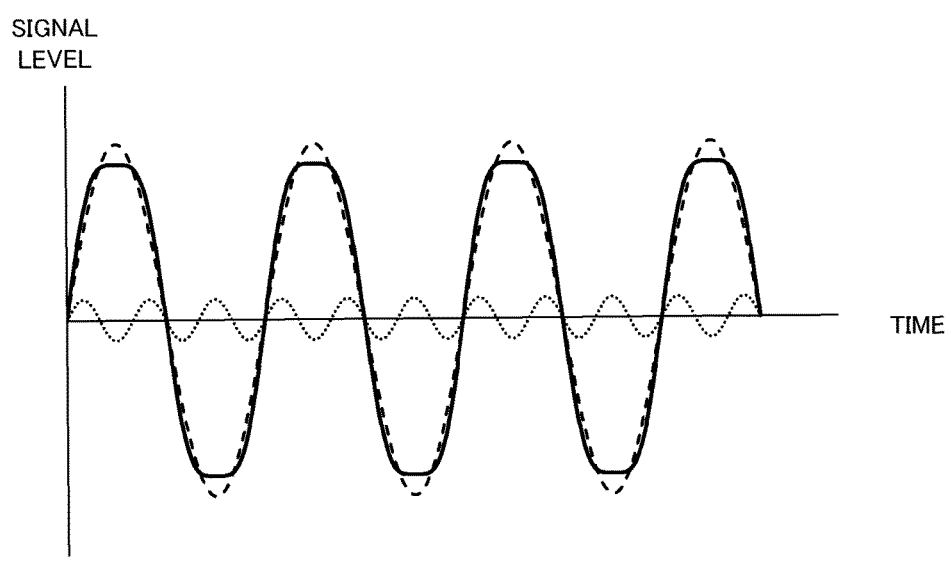
FIG. 2 is a diagram illustrating an example output of a limiter circuit according to the embodiment.

The shift control circuit 5 adjusts, for a control target signal input from the pre-emphasis circuit 4, the maximum frequency shift in frequency modulation performed by the modulator 6, which is described further below, so as to be equal to or less than a prescribed value, and outputs the information signal that is the adjusted control target signal to the modulator 6. A description is given of operation of each component in the shift control circuit 5. The limiter circuit 11 performs amplitude limitation that limits the amplitude of the control target signal to be equal to or less than a first threshold. The first threshold can be defined in accordance with the prescribed value of the maximum frequency shift in frequency modulation by the modulator 6. By performing the amplitude limitation, the waveform of the control target signal that has a larger wave height value than the first threshold is changed from the sinusoidal waveform to a waveform that can be substantially regarded as a rectangular waveform. The rectangular wave includes a fundamental wave, and a harmonic wave that has a frequency that is odd multiple of the frequency of the fundamental wave. That is, in the limiter circuit 11, a harmonic wave that has a frequency that is odd multiple of the frequency of the fundamental wave is produced. FIG. 2 is a diagram illustrating an example output of the limiter circuit according to the embodiment. In FIG. 2, the horizontal axis represents a time, while the vertical axis represents a signal level. The output of the limiter circuit 11 is represented by a continuous line. The output of the limiter circuit 11 includes the fundamental wave represented by a dashed line, and the harmonic wave represented by a dotted line.

In digital signal processing, only the frequency components up to ½ of the sampling frequency can be present, and in the case of the frequency components equal to or greater than the Nyquist frequency that is ½ of the sampling frequency, that is, in the case of the harmonic components, a phenomenon called a folding occurs. When, for example, the sampling frequency is 24 kHz, and when the limiter circuit 11 performs amplitude limitation on the control target signal of 2.6 kHz, the component of 23.4 kHz that is the ninth harmonic of 2.6 kHz folds back by 11.4 kHz at the boundary that is 12 kHz, and appears as the component of 0.6 kHz. The component of 0.6 kHz is an audible noise. The higher the sampling frequency becomes, the higher the Nyquist frequency also becomes, and the noise level produced by the folding decreases. By increasing the sampling frequency, the process load to the limiter circuit 11 increases. Hence, the sampling frequency of the limiter circuit 11 is defined in accordance with the noise level produced by the folding, and with the process load at the time of amplitude limitation.

The phase shifter 12 shifts, for the control target signal having the amplitude limited by the limiter circuit 11, a phase of a frequency component within a predetermined frequency range by a predetermined amount. The phase shifter 12 is an all-pass filter that includes, for example, an infinite impulse response (IIR) filter.

The harmonic suppressor 13 suppresses, for the control target signal phase-shifted by the phase shifter 12, a frequency component equal to or greater than a second threshold. The control target signal having the frequency component that is equal to or greater than the second threshold and is suppressed by the harmonic suppressor 13 is input to the modulator 6 as the information signal. The harmonic suppressor 13 suppresses the harmonic components produced by the amplitude limitation by the limiter circuit 11. The harmonic suppressor 13 is a splatter filter constructed by, for example, a finite impulse response (FIR) filter. The splatter filter attenuates the frequency component equal to or greater than the second threshold that is a cut-off frequency. The second threshold can be defined in accordance with a possible value of the frequency of the control target signal. When the splatter filter is accomplished by digital circuits, the attenuation characteristics of the splatter filter are sharp in comparison with those of analog circuits, and thus the harmonic components contained in the output of the limiter circuit 11 are severely suppressed in comparison with a case of analog circuits. When the harmonic components are severely suppressed, the wave height value of the signal to be applied to frequency modulation varies per frequency, and thus the maximum frequency shift in frequency modulation varies per frequency. Hence, in the wireless device 1 according to this embodiment, the phase shifter 12 shifts a phase of harmonic components by the predetermined amount.

When the cut-off frequency of the splatter filter that constitutes the harmonic suppressor 13 is 3 kHz, and when the limiter circuit 11 performs amplitude limitation on the control target signal of 0.9 kHz, harmonic components, such as 2.7 kHz that is triple and 4.5 kHz that is quintuple, are produced. Since the harmonic suppressor 13 suppresses the harmonic components greater than or equal to fifth harmonic, the output of the harmonic suppressor 13 contains the fundamental wave and the third harmonic. Conversely, when the limiter circuit 11 performs amplitude limitation on the control target signal of 1.1 kHz, harmonic components, such as 3.3 kHz that is triple and 5.5 kHz that is quintuple, are produced. Since the harmonic suppressor 13 suppresses the harmonic components greater than or equal to third harmonic, the output of the harmonic suppressor 13 contains the fundamental wave but does not contain the harmonics.

As illustrated in FIG. 2, the shape of the signal that contains the harmonic components can be regarded as a rectangular waveform. Conversely, the signal shape that contains the fundamental wave but does not contain the harmonic components can be regarded as a sinusoidal wave. In the above example, the output of the harmonic suppressor 13 has a variability in wave height value in the case of 0.9 kHz and in the case of 1.1 kHz. Since the wave height value is considerable as the maximum frequency shift in frequency modulation, the maximum frequency shift in frequency modulation varies depending on the case of 0.9 kHz and on the case of 1.1 kHz. In order to suppress the variability in the maximum frequency shift in frequency modulation, the phase shifter 12 shifts a phase of, for example, the third harmonic by the predetermined amount. The phase shift amount can be determined by simulations or tests. The phase shift by the phase shifter 12 suppresses the variability in wave height value, and also suppresses the variability in the maximum frequency shift in frequency modulation.

Figure 3:
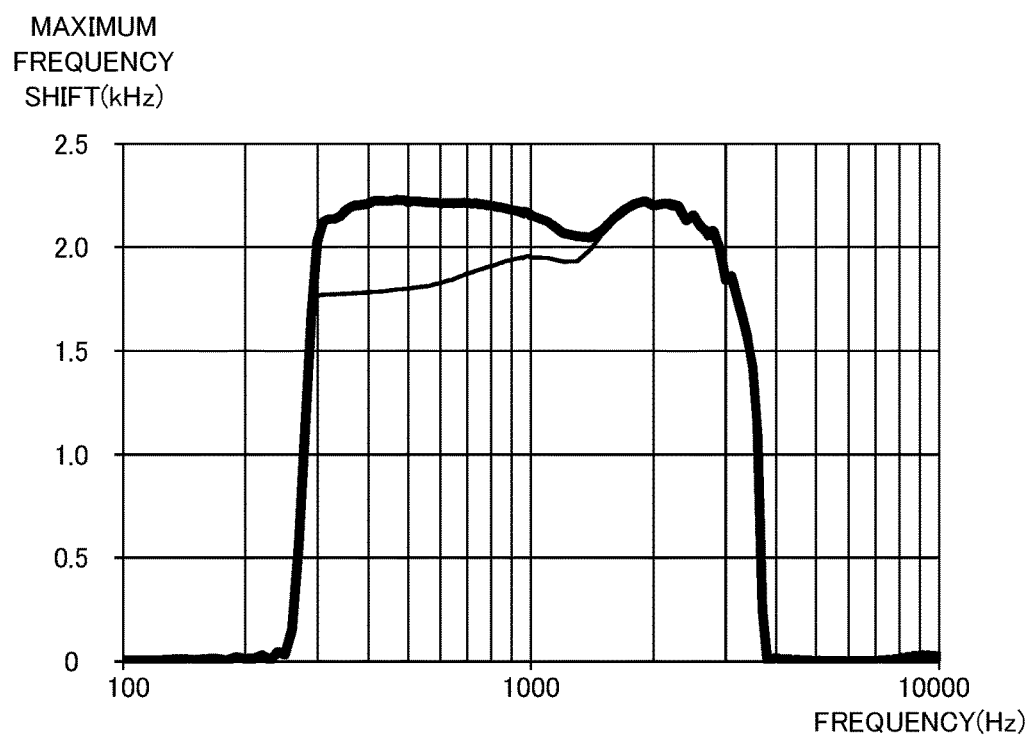
FIG. 3 is a diagram illustrating an example maximum frequency shift in frequency modulation by the wireless device according to the embodiment.

FIG. 3 is a diagram illustrating an example maximum frequency shift in frequency modulation by the wireless device according to the embodiment. In FIG. 3, the horizontal axis represents the frequency (unit: Hz) of the control target signal, while the vertical axis represents the maximum frequency shift (unit: kHz) in frequency modulation. The thin continuous line represents the maximum frequency shift when no phase shifter 12 is provided, and the thick continuous line represents the maximum frequency shift in frequency modulation performed by the wireless device 1 illustrated in FIG. 1. By setting the phase of the fundamental wave and that of the harmonic wave to be different values using the phase shifter 12 including the all-pass filter, the variability in wave height value is suppressed, and the variability in the maximum frequency shift per frequency is also suppressed. When harmonic waves are produced by the process of the limiter circuit 11, the respective phases of the harmonic waves may be set to be different values from one another.

Figure 4:
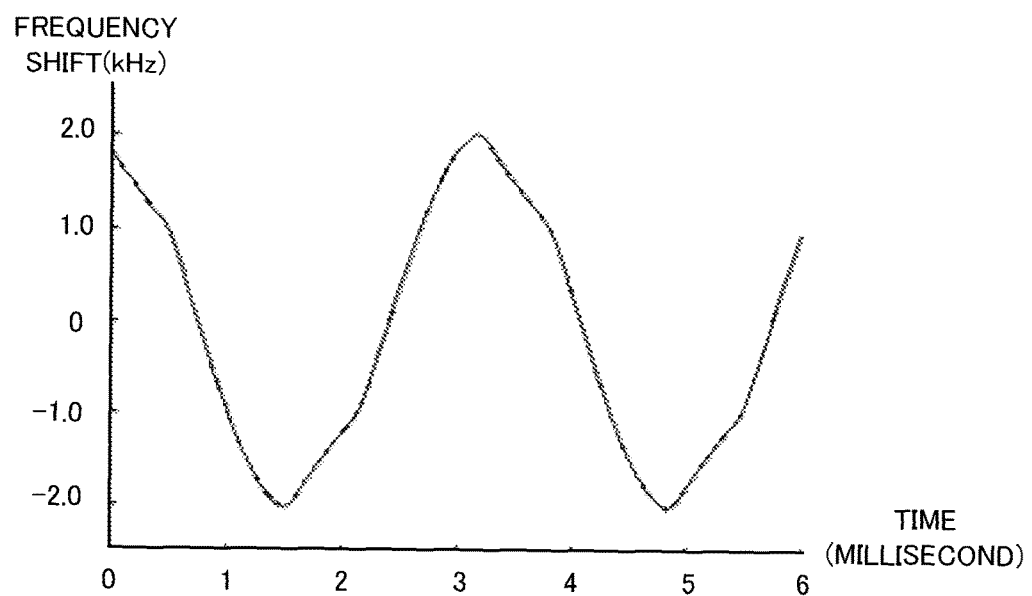
FIG. 4 is a diagram illustrating an example frequency shift in frequency modulation by the wireless device according to the embodiment.
Figure 5:
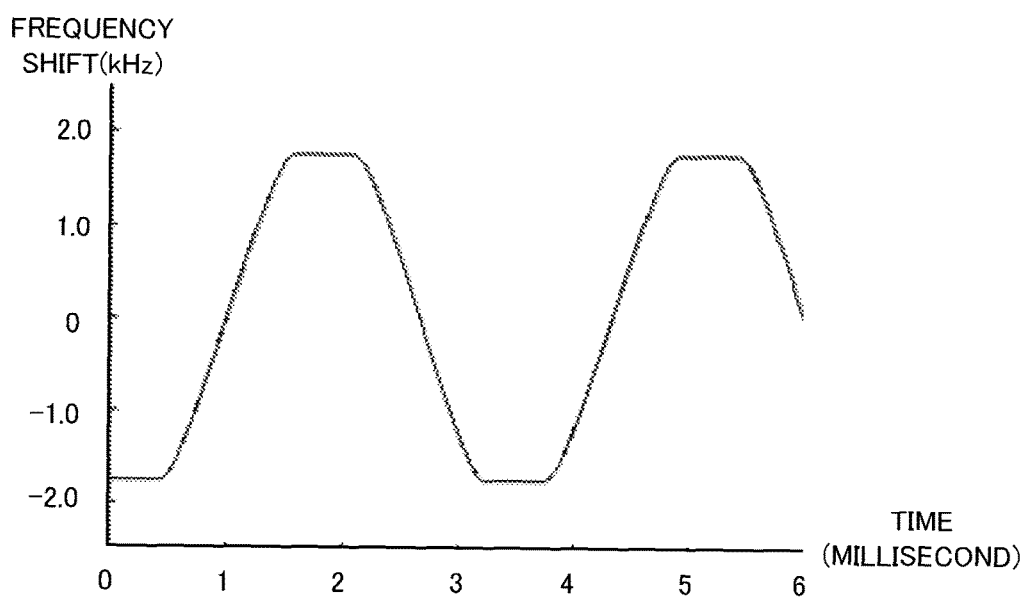
FIG. 5 is a diagram illustrating an example frequency shift in frequency modulation.

FIG. 4 is a diagram illustrating an example frequency shift in frequency modulation by the wireless device according to the embodiment. FIG. 4 illustrates the frequency shift in frequency modulation by the modulator 6 when the control target signal that has a frequency of 300 Hz is input to the shift control circuit 5. In FIG. 4, the horizontal axis represents a time (unit: millisecond), while the vertical axis represents a frequency shift (unit: kHz). FIG. 5 is a diagram illustrating an example frequency shift in frequency modulation. FIG. 5 is a diagram illustrating an example frequency shift in frequency modulation when the control target signal of 300 Hz has undergone the processes by the limiter circuit 11 and the harmonic suppressor 13, and the frequency modulation of changing the frequency of carrier wave is performed in accordance with the signal level of the signal to be output by the harmonic suppressor 13. That is, FIG. 5 illustrates an example frequency shift when no phase shifter 12 is provided. What the horizontal axis and the vertical axis in FIG. 5 represent are the same as those in FIG. 4. FIGS. 4 and 5 clarify that, when the frequency of the control target signal is 300 Hz, by providing the phase shifter 12, the maximum frequency shift increases. By providing the phase shifter 12 to increase the maximum frequency shift when the frequency of the control target signal is 300 Hz as described above, as indicated by the thick continuous line in FIG. 3, the variability in the maximum frequency shift per frequency is suppressed.

Figure 6:
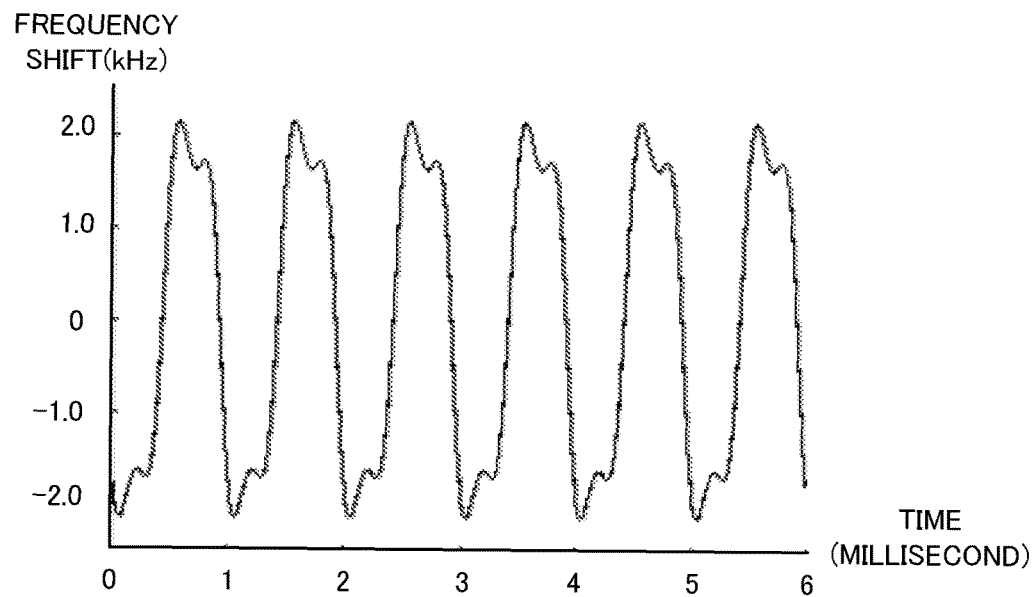
FIG. 6 is a diagram illustrating an example frequency shift in frequency modulation by the wireless device according to the embodiment.
Figure 7:
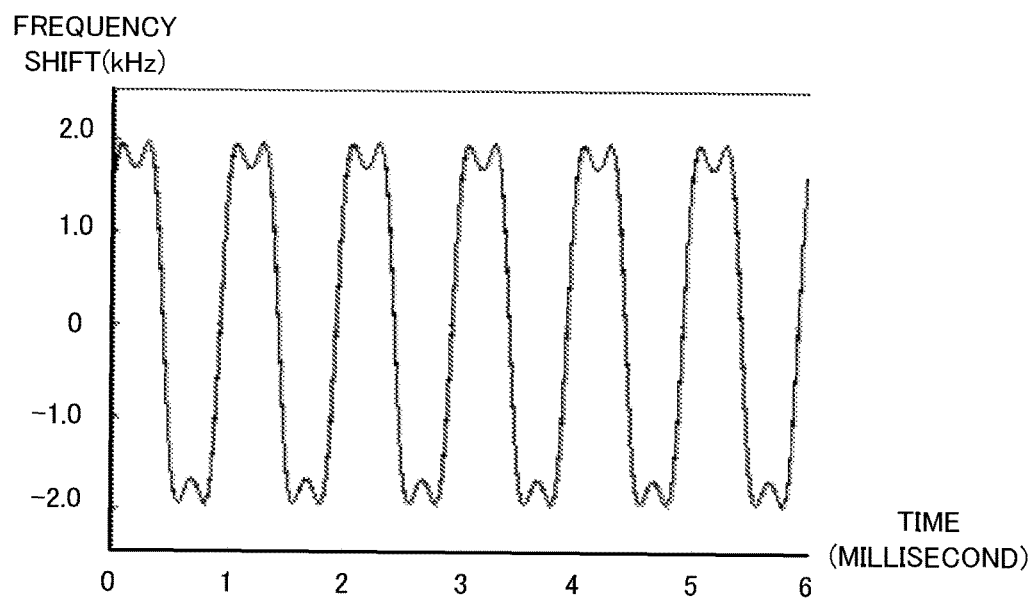
FIG. 7 is a diagram illustrating an example frequency shift in frequency modulation.

FIG. 6 is a diagram illustrating an example frequency shift in frequency modulation by the wireless device according to the embodiment. FIG. 6 illustrates the frequency shift in frequency modulation by the modulator 6 when the control target signal of 1 kHz is input to the shift control circuit 5. What the horizontal axis and the vertical axis in FIG. 6 represent are the same as those in FIG. 4. FIG. 7 is a diagram illustrating an example frequency shift in frequency modulation when the control target signal that has a frequency of 1 kHz has undergone the processes by the limiter circuit 11 and the harmonic suppressor 13, and the frequency modulation of changing the frequency of carrier wave is performed in accordance with the signal level of the signal to be output by the harmonic suppressor 13. What the horizontal axis and the vertical axis in FIG. 7 represent are the same as those in FIG. 4. FIGS. 6 and 7 clarify that, when the frequency of the control target signal is 1 kHz, by providing the phase shifter 12, the maximum frequency shift increases. By providing the phase shifter 12 to increase the maximum frequency shift when the frequency of the control target signal is 1 kHz as described above, as indicated by the thick continuous line in FIG. 3, the variability in the maximum frequency shift per frequency is suppressed.

Figure 8:
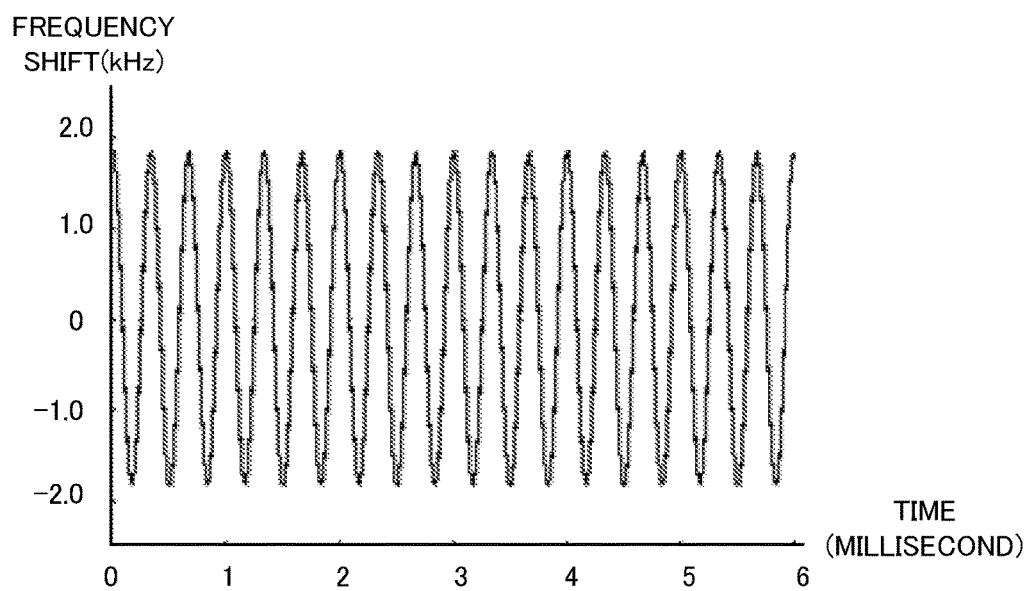
FIG. 8 is a diagram illustrating an example frequency shift in frequency modulation by the wireless device according to the embodiment.
Figure 9:
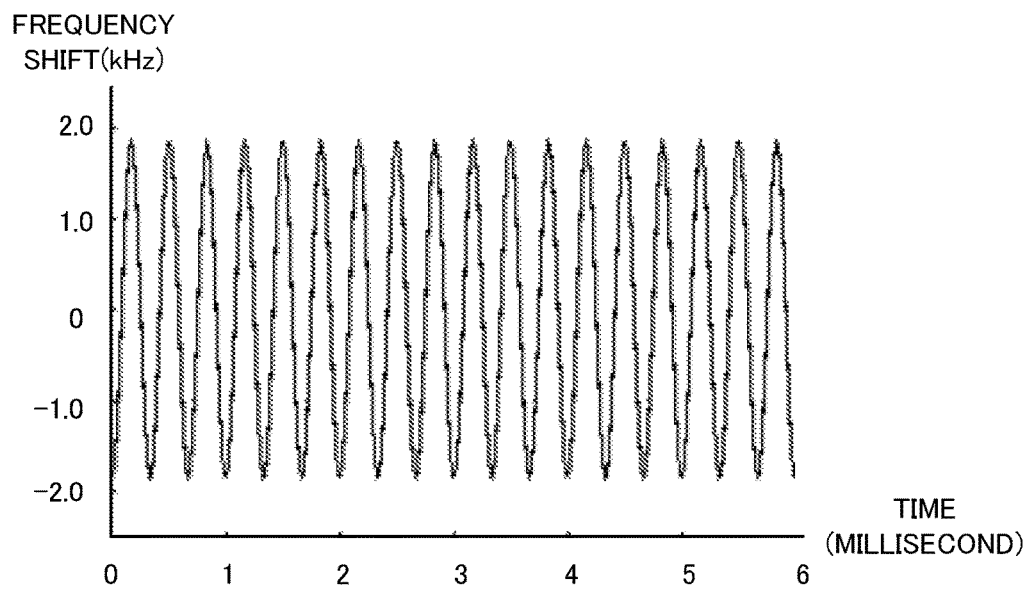
FIG. 9 is a diagram illustrating an example frequency shift in frequency modulation.

FIG. 8 is a diagram illustrating an example frequency shift in frequency modulation by the wireless device according to the embodiment. FIG. 8 illustrates the frequency shift in frequency modulation by the modulator 6 when the control target signal of 3 kHz is input to the shift control circuit 5. What the horizontal axis and the vertical axis in FIG. 8 represent are the same as those in FIG. 4. FIG. 9 is a diagram illustrating an example frequency shift in frequency modulation when the control target signal of 3 kHz has undergone the processes by the limiter circuit 11 and the harmonic suppressor 13, and the frequency modulation of changing the frequency of carrier wave is performed in accordance with the signal level of the signal to be output by the harmonic suppressor 13. What the horizontal axis and the vertical axis in FIG. 9 represent are the same as those in FIG. 4. FIGS. 8 and 9 clarify that, when the frequency of the control target signal is 3 kHz, even if the phase shifter 12 is provided, the maximum frequency shift remains unchanged. This is because when the frequency of the control target signal is 3 kHz, the output of the harmonic suppressor 13 does not contain harmonics.

FIGS. 4 to 9 clarify that the lower the frequency becomes, the greater the maximum frequency shift increases by the provided phase shifter 12. That is, by providing the phase shifter 12, as illustrated in FIG. 3, the variability in wave height value is suppressed, and the variability in the maximum frequency shift per frequency is also suppressed.

By applying the phase shifter 12 that is an all-pass filter and by adjusting the Q value or center frequency of the all-pass filter, the adjustment of the maximum frequency shift characteristics is simplified. Since the all-pass filter can be accomplished by an IIR filter as described above, in comparison with an FIR filter, the process load can be reduced. Since the all-pass filter has no gain, that is, does not change the amplitude, nothing affects to the modulation sensitivity, and the maximum frequency shift characteristics can be adjusted.

The modulator 6 performs frequency modulation of changing the frequency of the carrier wave in accordance with the signal level of the information signal to be output by the harmonic suppressor 13. The transmitter 7 produces a transmission signal from the carrier wave frequency-modulated by the modulator 6, and outputs the produced signal via the antenna 8.

Figure 10:
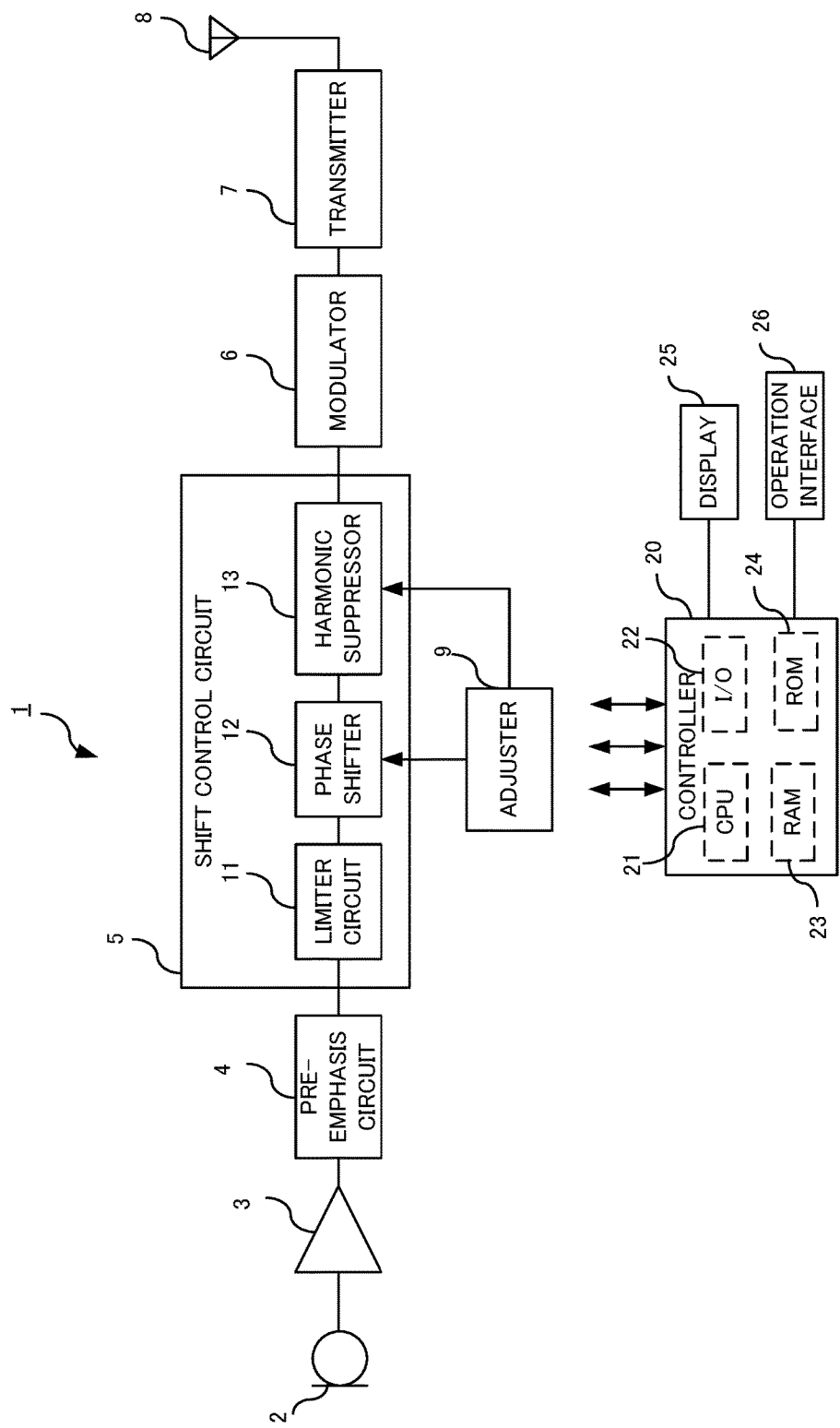
FIG. 10 is a block diagram illustrating another example configuration of the wireless device according to the embodiment.

FIG. 10 is a block diagram illustrating another example configuration of the wireless device according to the embodiment. The wireless device 1 illustrated in FIG. 10 includes, in addition to the configuration of the wireless device 1 illustrated in FIG. 1, an adjuster 9. The adjuster 9 adjusts at least one of the followings: the frequency range of the phase shifter 12 and the phase shift amount; and the second threshold used by the harmonic suppressor 13 in accordance with the occupied bandwidth of the transmission signal. For example, based on whether the wireless device 1 is in operation in the narrow-band mode or in the wide-band mode, the adjuster 9 adjusts the frequency range that is the target of the phase shift and the phase shift amount in the all-pass filter constituting the phase shifter 12, and the cut-off frequency of the splatter filter constituting the harmonic suppressor 13. The adjuster 9 may be built as a function of the controller 20.

As described above, according to the shift control circuit 5 of the wireless device 1 according to this embodiment, by shifting, for the control target signal having the amplitude limited by the limiter circuit 11, a phase of a frequency component within the predetermined frequency range by the predetermined amount, the variability in the maximum frequency shift in frequency modulation per frequency can be suppressed.

The present disclosure is not limited to the above embodiments. For example, the phase shifter 12, and the harmonic suppressor 13 may be accomplished by a single splatter filter that includes an IIR filter. The configuration in which the phase shifter 12 and the harmonic suppressor 13 are accomplished by the single IIR filter enables reduction of the number of taps for filtration.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A shift control circuit provided in a wireless device that performs frequency modulation, and outputting an information signal to be applied to the frequency modulation, the shift control circuit comprising:
   a limiter circuit that limits an amplitude of an input control target signal to be equal to or less than a first threshold;
   a phase shifter that shifts, for the control target signal having the amplitude limited by the limiter circuit, a phase of a frequency component within a predetermined frequency range by a predetermined amount; and
   a harmonic suppressor that suppresses, for the control target signal phase-shifted by the phase shifter, a frequency component equal to or greater than a second threshold, and outputs the information signal that is the suppressed control target signal.

2. The shift control circuit according to claim 1, wherein:
   the phase shifter is an all-pass filter comprising an infinite impulse response filter; and
   the harmonic suppressor is a splatter filter comprising a finite impulse response filter.

3. The shift control circuit according to claim 1, wherein the phase shifter and the harmonic suppressor are formed by a single splatter filter comprising an infinite impulse response filter.

4. A wireless device comprising:
   a shift control circuit that comprises a limiter circuit that limits an amplitude of an input control target signal to be equal to or less than a first threshold, a phase shifter that shifts, for the control target signal having the amplitude limited by the limiter circuit, a phase of a frequency component within a predetermined frequency range by a predetermined amount, and a harmonic suppressor that suppresses, for the control target signal phase-shifted by the phase shifter, a frequency component equal to or greater than a second threshold, and outputs an information signal that is the suppressed control target signal;
   a modulator that performs frequency modulation so as to change a frequency of a carrier wave in accordance with a signal level of the information signal; and
   a transmitter that produces a transmission signal from the carrier wave frequency-modulated by the modulator, and transmits the produced signal via an antenna.

5. The wireless device according to claim 4, wherein:
   the phase shifter is an all-pass filter comprising an infinite impulse response filter; and
   the harmonic suppressor is a splatter filter comprising a finite impulse response filter.

6. The wireless device according to claim 4, wherein the phase shifter and the harmonic suppressor are formed by a single splatter filter comprising an infinite impulse response filter.

7. The wireless device according to claim 4, further comprising an adjuster that adjusts, in accordance with an occupied bandwidth of the transmission signal, at least one of followings: the frequency range that is a target for the phase shift by the phase shifter and the predetermined amount of the phase shift; and the second threshold used by the harmonic suppressor.

8. The wireless device according to claim 5, further comprising an adjuster that adjusts, in accordance with an occupied bandwidth of the transmission signal, at least one of followings: the frequency range that is a target for the phase shift by the phase shifter and the predetermined amount of the phase shift; and the second threshold used by the harmonic suppressor.

9. The wireless device according to claim 6, further comprising an adjuster that adjusts, in accordance with an occupied bandwidth of the transmission signal, at least one of followings: the frequency range that is a target for the phase shift by the phase shifter and the predetermined amount of the phase shift; and the second threshold used by the harmonic suppressor.

\* \* \* \* \*